United States Patent
Park et al.

(10) Patent No.: US 9,159,680 B2
(45) Date of Patent: Oct. 13, 2015

(54) METHOD OF FABRICATING SEMICONDUCTOR DEVICE

(75) Inventors: Sang-Wook Park, Hwaseong-si (KR); Kwang-Yong Lee, Anyang-si (KR); Ho-Geon Song, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 671 days.

(21) Appl. No.: 13/486,155

(22) Filed: Jun. 1, 2012

(65) Prior Publication Data

US 2012/0309167 A1 Dec. 6, 2012

(30) Foreign Application Priority Data

Jun. 1, 2011 (KR) .................. 10-2011-0052992

(51) Int. Cl.
- *H01L 21/28* (2006.01)
- *H01L 21/78* (2006.01)
- *H01L 23/00* (2006.01)

(52) U.S. Cl.
CPC ............. *H01L 24/03* (2013.01); *H01L 24/05* (2013.01); *H01L 2224/02319* (2013.01); *H01L 2224/02331* (2013.01); *H01L 2224/02375* (2013.01); *H01L 2224/02377* (2013.01); *H01L 2224/02379* (2013.01); *H01L 2224/03003* (2013.01); *H01L 2224/03334* (2013.01); *H01L 2224/05548* (2013.01); *H01L 2224/05554* (2013.01); *H01L 2224/05567* (2013.01); *H01L 2224/05639* (2013.01); *H01L 2224/05647* (2013.01); *H01L 2224/05655* (2013.01); *H01L 2224/0603* (2013.01); *H01L 2224/06153* (2013.01); *H01L 2924/01327* (2013.01); *H01L 2924/1461* (2013.01); *H01L 2924/15787* (2013.01); *H01L 2924/15788* (2013.01)

(58) Field of Classification Search
CPC .............................................. H01L 2224/11825
See application file for complete search history.

(56) References Cited

U.S. PATENT DOCUMENTS

| 7,763,980 | B2 | 7/2010 | Liao et al. | |
|---|---|---|---|---|
| 2009/0243118 | A1* | 10/2009 | Akiba et al. | 257/773 |
| 2011/0304049 | A1* | 12/2011 | Shigihara et al. | 257/762 |
| 2014/0124914 | A1* | 5/2014 | Lin et al. | 257/712 |
| 2014/0124928 | A1* | 5/2014 | Lin et al. | 257/738 |

FOREIGN PATENT DOCUMENTS

| KR | 1020090032224 | 4/2009 |
|---|---|---|
| KR | 1020090084593 | 8/2009 |

* cited by examiner

*Primary Examiner* — Seahvosh Nikmanesh
(74) *Attorney, Agent, or Firm* — F. Chau & Associates, LLC

(57) ABSTRACT

A method of fabricating a semiconductor device includes preparing a semiconductor substrate having a circuit unit on an upper surface thereof, a metal pad electrically connected to the circuit unit, and a passivation layer that covers the circuit unit and exposes the metal pad, forming a first re-wiring layer that is electrically connected to the metal pad and is formed by a printing method to extend from the metal pad on the passivation layer and forming a second re-wiring layer on the first re-wiring layer using the first re-wiring layer as a seed by using an electro-plating process.

15 Claims, 11 Drawing Sheets

METHOD OF FABRICATING SEMICONDUCTOR DEVICE

CROSS-REFERENCE TO RELATED APPLICATIONS

This application claims priority to Korean Patent Application No. 10-2011-0052992, filed on Jun. 1, 2011, the disclosure of which is hereby incorporated by reference herein in its entirety.

BACKGROUND

Exemplary embodiments of inventive concept relate to a method of fabricating a semiconductor device, and more particularly, to a method of fabricating a semiconductor device having a re-wiring layer.

The volumes of electronic devices are being gradually reduced while the process of a large capacity of data may now be required. Accordingly, electronic parts included in the electronic devices may be required to be optimally arranged. Accordingly, external terminals of semiconductor devices are redistributed by re-wirings; however, this may result in process complexity and cost increase.

SUMMARY

Exemplary embodiments of the inventive concept may provide a method of fabricating a semiconductor device having a re-wiring layer.

According to an exemplary embodiment of the inventive concept, there is provided a method of fabricating a semiconductor device.

The method may include preparing a semiconductor substrate having a circuit unit on an upper surface thereof, a metal pad electrically connected to the circuit unit, and a passivation layer that covers the circuit unit and exposes the metal pad, forming a first re-wiring layer that is electrically connected to the metal pad and is formed by a printing method to extend from the metal pad on the passivation layer, and forming a second re-wiring layer on the first re-wiring layer using the first re-wiring layer as a seed by using an electro-plating process.

The forming of the first re-wiring layer may include forming the first re-wiring layer to cover a portion of an upper surface of the metal pad, and the forming of the second re-wiring layer by using an electroplating method may include forming the second re-wiring layer on the first re-wiring layer and the metal pad.

The method may further include electroless plating a metal bump layer that covers the metal pad exposed by the passivation layer before forming the first re-wiring layer, wherein the first re-wiring layer is formed to expose a portion of the metal bump layer, and the second re-wiring layer is formed to cover the first re-wiring layer and the metal bump layer.

The method may further include zincate processing a surface of the metal pad before electroless plating the metal bump layer.

The zincate processing may include removing a natural oxide film formed on a surface of the metal pad.

The electroless plating of the metal bump layer may include forming the metal bump layer only on the metal pad.

The metal bump layer may include nickel.

The first re-wiring layer may be formed by a printing method using a paste that includes silver, nickel, or copper.

The second re-wiring layer may include gold or copper.

The forming of the first re-wiring layer may include forming the first re-wiring layer by using a roll off-set printing method.

The semiconductor substrate may include chip regions where the circuit unit is formed, scribe lane regions around the chip regions, and a plurality of the metal pads, wherein the first re-wiring layer that extends from one of the metal pads on the passivation layer is formed to be separated from the first re-wiring layer that extends from another metal pad to the passivation layer in the chip region, and each of the first re-wiring layers that extends from the metal pads is formed to extend from the chip regions to the scribe lane regions, and each of the first re-wiring layers that extends from the metal pads forms connection units that are connected to each other in the scribe lane regions.

The semiconductor substrate may include a plurality of chip regions, and the method may further include separating the chip regions into a plurality of individual chip regions by cutting the connection units along the scribe lane regions after forming the second re-wiring layer.

The method may further include forming the passivation layer that covers at least a portion of the second re-wiring layer before separating the chip regions into the individual chip regions.

According to an exemplary embodiment of the inventive concept, there is provided a method of fabricating a semiconductor device, the method may include: preparing a semiconductor substrate having a circuit unit, a metal pad electrically connected to the circuit unit, and a passivation layer that covers the circuit unit and exposes the metal pad, and forming a re-wiring layer that is electrically connected to the metal pad on the metal pad and the passivation layer by using a roll off-set printing method.

The forming of the re-wiring layer may include forming the re-wiring layer by using a roll off-set printing method that uses a silicon blanket roll.

According to an exemplary embodiment of the inventive concept, a method of fabricating a semiconductor device is provided. The method includes providing a semiconductor wafer including a semiconductor substrate including a base substrate and a circuit unit formed on the base substrate, and the semiconductor substrate is defined into a plurality of chip regions and a plurality of scribe lane regions around the chip regions, forming a plurality of metal pads on the semiconductor substrate in the chip regions with the metal pads electrically connected to the circuit unit, forming a passivation layer covering an upper surface of the circuit unit, except for a portion of the metal pads, forming a plurality of dummy units on the base substrate in the scribe lane regions which correspond to the circuit unit, forming a natural oxide film on an upper surface of the metal pads which is exposed by the passivation layer, removing the natural oxide film, sequentially stacking a contact film having a conductivity and a metal bump layer on a portion of each of the metal pads exposed by the passivation layer such that the contact films are disposed between the metal bump layers and the metal pads and forming a first re-wiring layer on each of the metal bump layers and on the passivation layer. The first re-wiring layers each expose a portion of a respective one of the metal bump layers and extend from a respective one of the metal bump layers on the passivation layer, and the first re-writing layers are electrically connected to the metal pads.

In addition, the method further includes forming a second re-wiring layer directly contacting an upper surface of each of the first re-wiring layers and each of the exposed metal bump layers in the chip regions, and a thickness of the second re-wiring layers is greater than a thickness of the first re-wiring layers and the second re-wiring layers cover substantially all upper surfaces of the first re-wiring layers and the metal pads in the chip regions; and forming an auxiliary passivation layer on the second re-wiring layers. The auxiliary passivation layer includes an opening therein which exposes a portion of the second re-wiring layers.

BRIEF DESCRIPTION OF THE DRAWINGS

Exemplary embodiments of the inventive concept can be more clearly understood from the following detailed description taken in conjunction with the accompanying drawings in which.

DETAILED DESCRIPTION OF EXEMPLARY EMBODIMENTS

Figure 1:
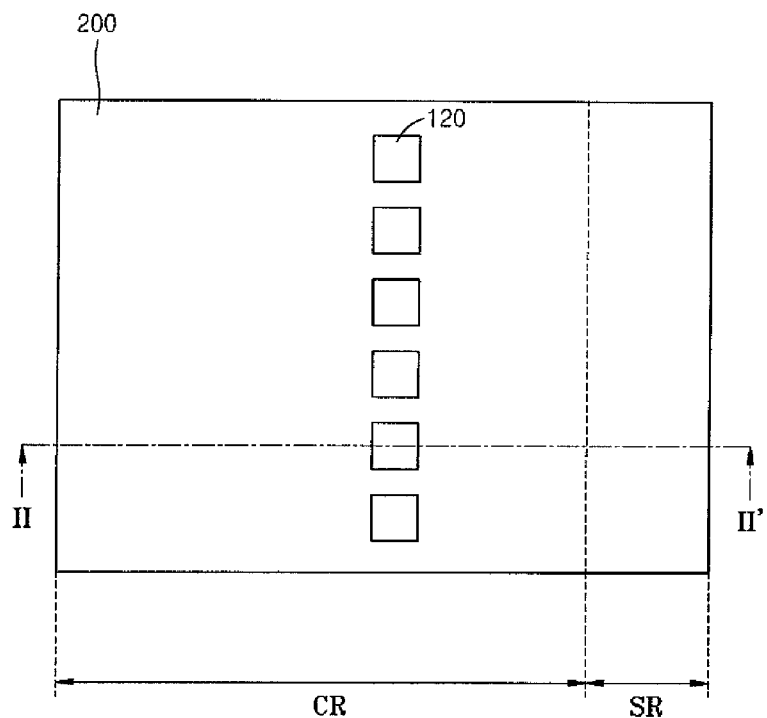
FIGS. 1 and 2 are respectively a plane view and a cross-sectional view of a semiconductor substrate of a semiconductor device having metal pads according to an exemplary embodiment of the inventive concept.

Exemplary embodiments of the inventive concept will be described more fully with reference to the accompanying drawings, in which exemplary embodiments of the inventive concept are shown.

Exemplary embodiments of this invention may, however, be embodied in many different forms and should not be construed as limited to exemplary embodiments set forth herein.

Hereinafter, exemplary embodiments of the present invention will be explained in detail with reference to the accompanying drawings, wherein the same reference numerals may be used to denote the same or substantially the same elements throughout the specification and the drawings. Exemplary embodiments of the present invention may be embodied in various different ways and should not be construed as limited to exemplary embodiments described herein.

It will be understood that when an element or layer is referred to as being "on", "connected to" or "coupled to" another element or layer, it can be directly on, connected to or coupled to the other element or layer or intervening elements or layers may be present.

As used herein, the singular forms, "a", "an", and "the" are intended to include plural forms as well, unless the context clearly indicates otherwise.

Figure 2:
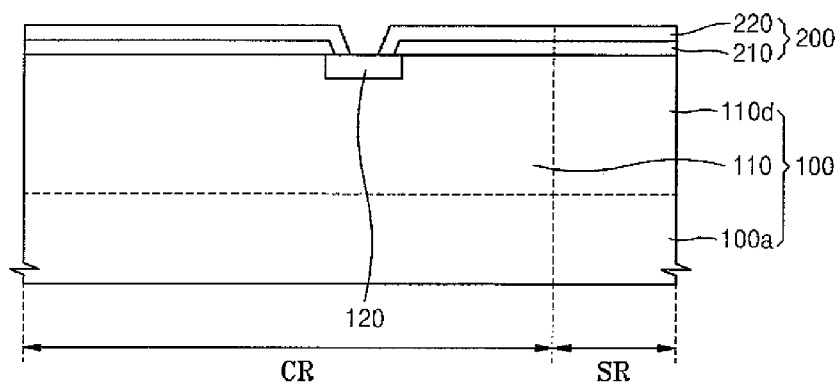

FIGS. 1 and 2 are respectively a plane view and a cross-sectional view of a semiconductor substrate 100 of a semiconductor device having, for example, metal pads 120, according to an exemplary embodiment of the inventive concept. More specifically, FIG. 2 is a cross-sectional view taken along line of FIG. 1.

Referring to FIGS. 1 and 2, the metal pads 120 and a passivation layer 200 that expose at least portions of the metal pads 120 are formed on the semiconductor substrate 100. The semiconductor substrate 100 may include, for example, a base substrate 100a and a circuit unit 110 formed on the base substrate 100a. The circuit unit 110 may be formed on an upper surface of the semiconductor substrate 100. The metal pads 120 are electrically connected to the circuit unit 110 to transmit an external power source/ground or a signal to the circuit unit 110.

The base substrate 100a may include a semiconductor material such as, for example, a group IV semiconductor, a group compound semiconductor, or a group II-VI oxide semiconductor. For example, the group IV semiconductor may be silicon, germanium, or silicon-germanium. The base substrate 100a may be, for example, a silicon-on-insulator (SOI) substrate, a gallium-arsenic substrate, a silicon-germanium substrate, a ceramic substrate, a quartz substrate, or a glass substrate for display.

The circuit unit 110 may include various kinds of active devices or passive devices for constituting a semiconductor device such as, for example, a highly integrated circuit semiconductor memory device such as a dynamic random access memory (DRAM), a static random access memory (SRAM), and flash memory, a processor such as a central processor unit (CPU), a digital signal processor (DSP), or a combination of the CPU and the DSP, an application-specific integrated circuit (ASIC), a micro electro mechanical system (MEMS) device, an optoelectronic device, and a display device. Also, the circuit unit 110 may include conductive lines (for example, a word line and a bit line), metal wire lines, contact plugs, and via plugs, etc. for electrically connecting the active devices and the passive devices. Also, the circuit unit 110 may further include, for example, inter-layer dielectric (ILD) layers or inter-metal dielectric (IMD) layers disposed between the active devices, the passive devices, the conductive lines, the metal lines, the contact plugs, and the via plugs.

The metal pads 120 may be formed as, for example, one-body with and on the same level as the uppermost metal wire line of the metal wire lines included in the circuit unit 110. Alternatively, the metal pads 120 may be formed, for example, separately from the uppermost metal wire line by electrically contacting the metal wire line after forming the metal wire lines included in the circuit unit 110.

The passivation layer 200 may be formed, for example, to cover an upper surface of the circuit unit 110, except portions of the metal pads 120 to protect the circuit unit 110. The passivation layer 200 may include, for example, a first passivation layer 210 and a second passivation layer 220. The first passivation layer 210 may be formed of, for example, a nitride. The second passivation layer 220 may be optionally formed on the first passivation layer 210 using, for example, a polymer. The second passivation layer 220 may be, for example, an elastic member to mitigate an external impact.

The semiconductor substrate 100 may be defined into, for example, chip regions CR and scribe lane regions SR. In a subsequent process, the semiconductor substrate 100 is cut along the scribe lane regions SR so that the chip regions CR form individual semiconductor chips.

In the scribe lane regions SR, dummy units 110d corresponding to the circuit unit 110 of the chip regions CRs may be formed on the base substrate 100a. An insulating layer (not shown) may be formed, for example, on the dummy units 110d so that upper surfaces of the chip regions CRs and scribe lane regions CRs have heights similar to each other. The dummy units 110d may be formed as dummy patterns for process stabilization or test patterns for quality control of the semiconductor device.

Figure 3:
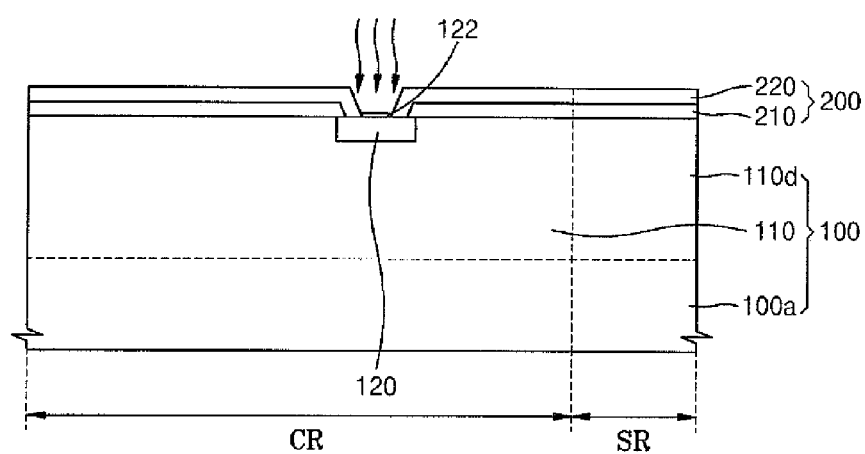
FIG. 3 is a cross-sectional view showing an operation of removing an natural oxide film, according to an exemplary embodiment of the inventive concept.

FIG. 3 is a cross-sectional view showing an operation of removing a natural oxide film 122, according to an exemplary embodiment of the inventive concept.

Referring to FIG. 3, when the natural oxide film 122 is formed on an upper surface of the metal pad 120 that is exposed by the passivation layer 200, a process of removing the natural oxide film 122 may be performed. For example, when the metal pad 120 is formed of aluminum, the natural oxide film 122 formed of an aluminum oxide may be formed on the metal pad 120.

In the case that the natural oxide film 122 is formed on the metal pad 120, an external power source/ground or a signal may not be transmitted to the circuit unit 110. However, in the case that no natural oxide film 122 is formed on the metal pad 120 or the natural oxide film 122 is formed on the metal pad 120 at a level that does not largely affect the transmission of an external power source/ground or a signal, the process for removing the natural oxide film 122 may be omitted.

The removal of the natural oxide film 122 may be performed using, for example, a wet or dry washing/etching process that may remove an oxide. Also, the removal of the natural oxide film 122 may be performed using, for example, a zincate process in which, after removing the natural oxide film 122, a thin zinc film is formed.

Figure 4:
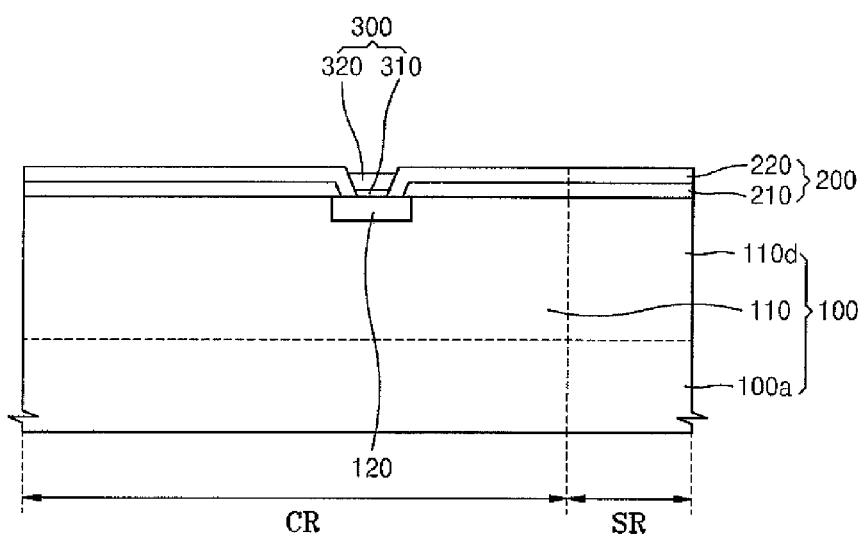
FIG. 4 is a cross-sectional view showing an operation of forming a metal bump layer, according to an exemplary embodiment of the inventive concept.

FIG. 4 is a cross-sectional view showing an operation of forming a metal bump layer 320, according to an exemplary embodiment of the inventive concept.

Referring to FIG. 4, the metal bump layer 320 may be formed on the metal pad 120. A portion of the metal pad 120 exposed by the passivation layer 200 may be covered by the metal bump layer 320. The metal bump layer 320 may reduce a step difference between the metal pad 120 and the passivation layer 200. The metal bump layer 320 may be formed by, for example, an electroless plating method. Also, after forming a preliminary metal bump layer on the semiconductor substrate 100, the metal bump layer 320 may be formed by, for example, a planarizing process that removes a portion of the preliminary metal bump layer to expose the passivation layer 200. The planarizing process for forming the metal bump layer 320 may be, for example, a chemical mechanical polishing (CMP) method or an etch-back method.

The metal bump layer 320 may be formed of a metal such as, for example, nickel, aluminum, copper, silver, or gold. A contact film 310 having conductivity may further be formed between the metal bump layer 320 and the metal pad 120.

When the metal bump layer 320 is formed using an electroless plating method, the contact film 310 may be formed of, for example, zinc and the metal bump layer 320 may be formed of, for example, nickel. When the contact film 310 is formed on the metal pad 120 using zinc by a zincate process, the metal bump layer 320 may be optionally formed on the contact film 310 by, for example, an electroless plating method. Moreover, when the contact film 310 is formed by a zincate process, the natural oxide film 122 (refer to FIG. 3) formed on the metal pad 120 may be removed, and the metal bump layer 320 formed by an electroless plating method may optionally be removed. Accordingly, the contact film 310 may reduce a contact resistance between the metal pad 120 and the metal bump layer 320. The contact film 310 and the metal bump layer 320 may both be referred to as an electroless plating layer 300.

Figure 5:
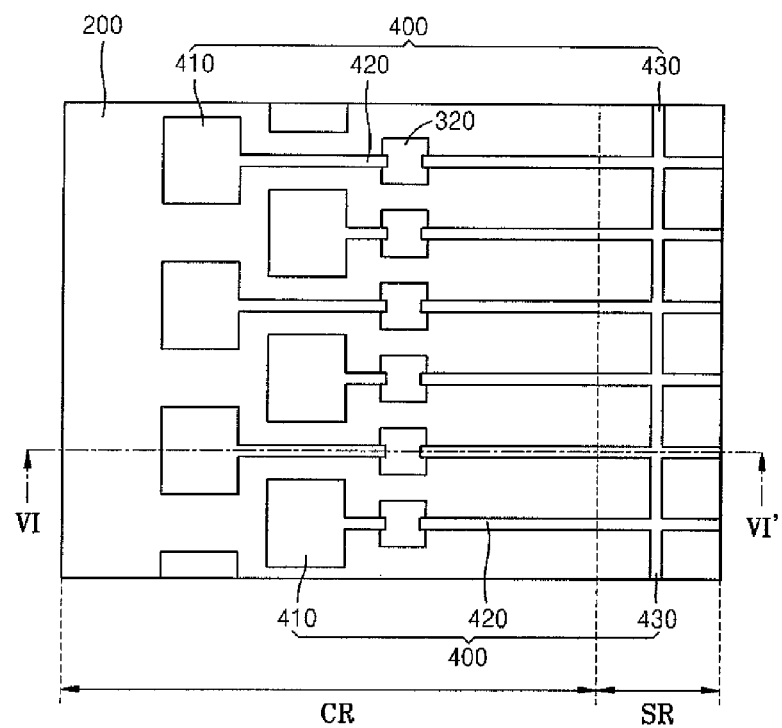
FIGS. 5 and 6 are respectively a plane view and a cross-sectional view showing an operation of forming a first re-wiring layer, according to an exemplary embodiment of the inventive concept.
Figure 6:
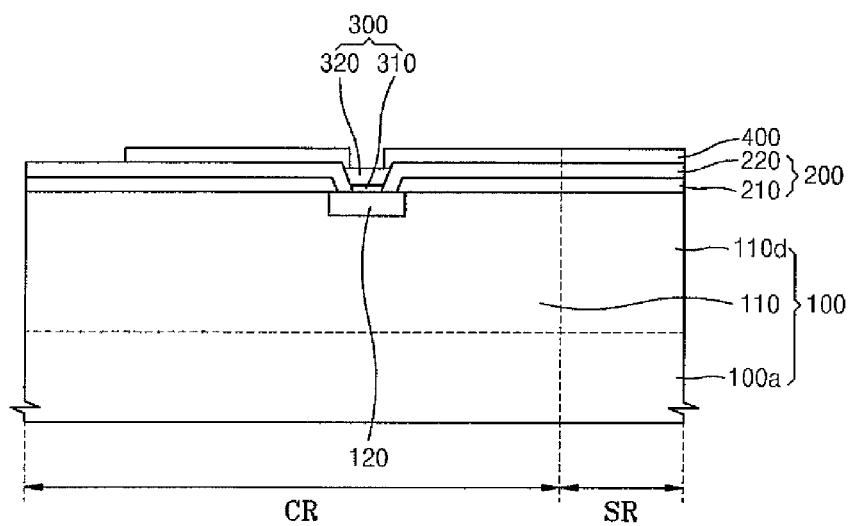

FIGS. 5 and 6 are respectively a plane view and a cross-sectional view showing an operation of forming a first re-wiring layer 400 according to an exemplary embodiment of the inventive concept. More specifically, FIG. 6 is a cross-sectional view taken along line Vi-Vi' of FIG. 5.

Referring to FIGS. 5 and 6, the first re-wiring layer 400 is formed on the metal bump layer 320 and the passivation layer 200. The first re-wiring layer 400 may expose a portion of the metal bump layer 320. The first re-wiring layer 400 may include, for example, a first extension pad portion 410, a first extension portion 420, and a first connection unit 430. The first re-wiring layer 400 may be formed of a metal such as, for example, silver, nickel, or copper. The first re-wiring layer 400 may be formed by, for example, a soft lithography process and not a photolithography process that uses a photomask. The first re-wiring layer 400 may be formed by, for example, a printing method that uses a paste or ink that includes, for example, silver, nickel, or copper. The first re-wiring layer 400 may be formed by, for example, a roll off-set printing method. The roll off-set printing method will be described below with reference to FIGS. 16 through 18.

The first extension pad portion 410 may function as a pad that is practically connected to an external device by electrically connecting with the metal pad 120. The first extension pad portion 410 may have, for example, an area greater than that of the metal pad 120. When the metal pad 120 is formed on the metal bump layer 320, the first extension pad portion 410 may have an area greater than that of the metal bump layer 320.

The first extension portion 420 may extend from the metal bump layer 320 to the first extension pad portion 410 to connect the metal bump layer 320 to the first extension pad portion 410. The first extension portion 420 may extend from the metal bump layer 320 to the first connection unit 430 to connect the metal bump layer 320 to the first connection unit 430. Although it is depicted that a portion of the first extension portion 420 that connects the metal bump layer 320 to the first extension pad portion 410 and a portion of the first extension portion 420 that connects the metal bump layer 320 to the first connection unit 430 are disconnected, it is noted however that these portions of the first extension portion 420 extending from one metal bump layer 320 may also be connected to each other. The first extension portion 420 may be formed to extend from a chip region CR to a scribe lane region SR.

The first connection unit 430 is formed in the scribe lane region SR and may connect the extension portions of the first re-wiring layer 400, that is, the first extension portions 420 extending towards the scribe lane region SR from the chip region CR, to each other. Accordingly, all of the first re-wiring layers 400 may be electrically connected through the first connection unit 430.

The first re-wiring layer 400 may be formed to extend from the metal pad 120 on the passivation layer 200. That is, when the metal bump layer 320 is formed on the metal pad 120, the first re-wiring layer 400 may be formed to extend from the metal bump layer 320 on the passivation layer 200. When a plurality of metal pads 120 are formed, the first re-wiring layer 400 extending from each of the metal pads 120 may be formed to be separated from each other in the chip region CR.

Although not shown, the first re-wiring layers 400 extending from the metal pads 120 to which the same power source/ground/signal is transmitted may optionally be formed to be connected to each other. For example, in the case of the metal pad 120 to which an external power source is connected, a multiple number of metal pads 120 may be formed to compensate for voltage drop in the circuit unit 110. In this case, the first re-wiring layers 400 extending from the multiple number of metal pads 120 to which an external power source is connected may also be connected to each other in the chip region CR. However, the first re-wiring layers 400 extending from the metal pads 120 that perform different functions may be formed to be separated from each other in the chip region CR.

The first re-wiring layers 400 extending from each of the metal pads 120 may be formed to be connected to each other in the scribe lane region SR. Accordingly, the first connection unit 430 by which all the first re-wiring layers 400 are connected may be formed in the scribe lane region SR.

Figure 7:
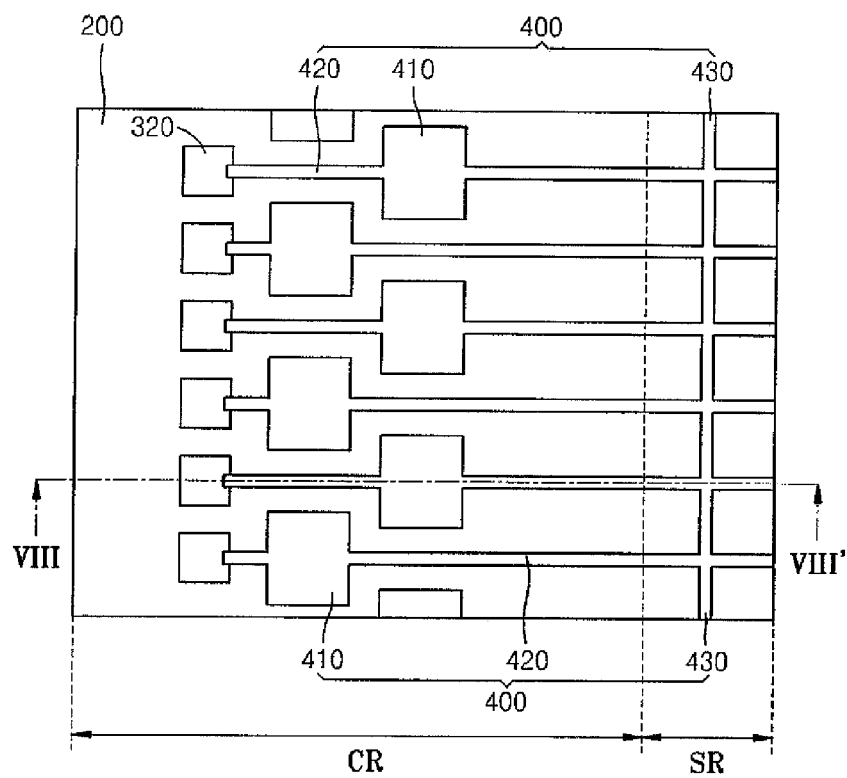
FIGS. 7 and 8 are respectively a plane view and a cross-sectional view showing an operation of forming a first re-wiring layer, according to a modified exemplary embodiment of the inventive concept.
Figure 8:
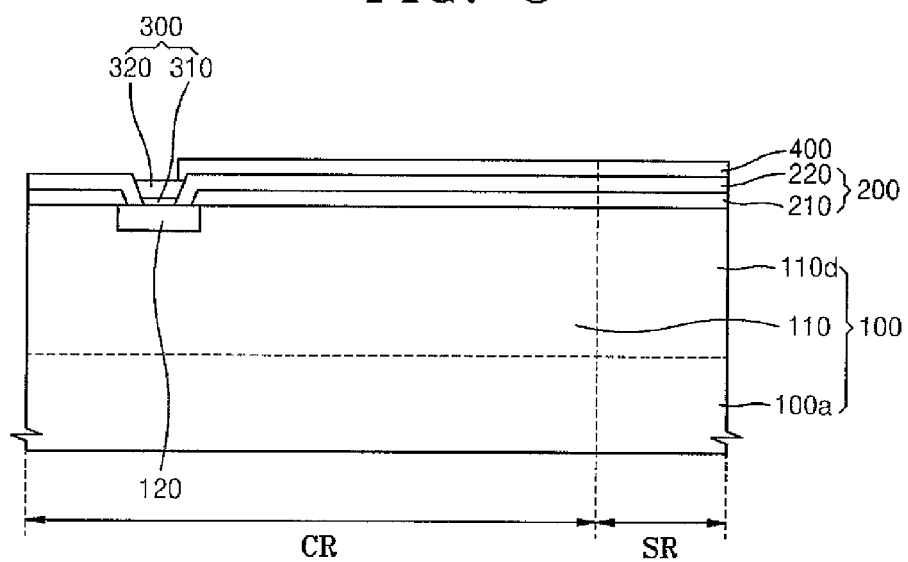

FIGS. 7 and 8 are respectively a plane view and a cross-sectional view showing an operation of forming a first re-wiring layer 400 according to a modified exemplary embodiment of the inventive concept. More specifically, FIG. 8 is a cross-sectional view taken along line VIII-VIII' of FIG. 7.

Referring to FIGS. 7 and 8, the first re-wiring layer 400 may be formed on portions of the metal bump layer 320 and the passivation layer 200. The first re-wiring layer 400 may include, for example, the first extension pad portion 410, the first extension portion 420, and the first connection unit 430.

The first extension portion 420 may be formed to extend from the metal bump layer 320 to the first extension pad portion 410 to connect the metal bump layer 320 to the first extension pad portion 410. Also, the first extension portion 420 may be formed to extend from the first extension pad portion 410 to the first connection unit 430 to connect the first extension pad portion 410 to the first connection unit 430.

When FIGS. 5 and 6 are compared with FIGS. 7 and 8, the metal pads 120 shown in FIGS. 5 and 6 may be, for example, edge-type metal pads disposed adjacent to a boundary of the chip region CR, and the metal pads 120 shown in FIGS. 7 and 8 may be, for example, intermediate type metal pads disposed in the middle of the chip region CR. In this way, as shown in FIGS. 5 through 8, the shape of the first re-wiring layer 400 may slightly differ according to the position of the metal pad 120 in the chip region CR. However, the metal pads 120 may perform the same functions in that the metal pads 120 extend to the scribe lane region SR while electrically connecting the metal pads 120 to the first extension pad portions 410.

Figure 9:
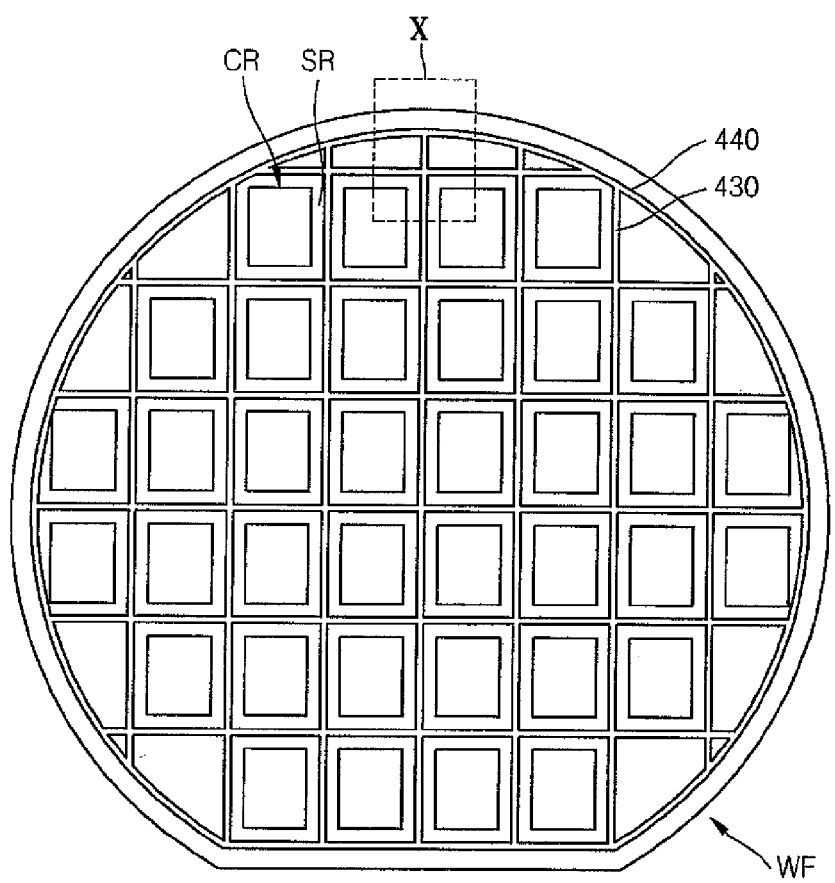
FIG. 9 is a plane view showing the disposition of wafer chip regions and scribe lane regions according to an exemplary embodiment of the inventive concept.

FIG. 9 is a plane view showing the disposition of wafer chip regions and scribe lane regions according to an exemplary embodiment of the inventive concept.

Referring to FIG. 9, a wafer WF includes, for example, a plurality of chip regions CR and scribe lane regions SR around the chip regions CR. The wafer WF may be, for example, a semiconductor wafer having a diameter of a few to a few tens of inches. The base substrate 100a shown in FIGS. 1 through 12 or the semiconductor substrate 100 in which the circuit unit 110 is formed on the base substrate 100a may be a portion of the wafer WF.

In FIG. 9, most of other constituent elements are omitted to show the disposition relationship of the chip regions CR, the scribe lane regions SR, and the first connection units 430 on the wafer WF.

The first connection units 430 may be formed along the scribe lane regions SR to surround the chip regions CR. All of the first connection units 430 formed on the wafer WF may be connected to each other. The wafer WF may further include, for example, an extension connection unit 440 that is formed along an outer rim of the wafer WF and which is separated from the chip regions CR. The extension connection unit 440 may be formed, for example, together with the first connection units 430 by using the same method used to form the first connection units 430. The extension connection unit 440 may be formed to connect the first connection units 430 along the outer rim of the wafer WF.

The scribe lane regions SR may include all regions of the wafer WF except the chip regions CR. That is, regions of the wafer WF where the chip regions CR are not formed may be referred to as the scribe lane regions SR.

Figure 10:
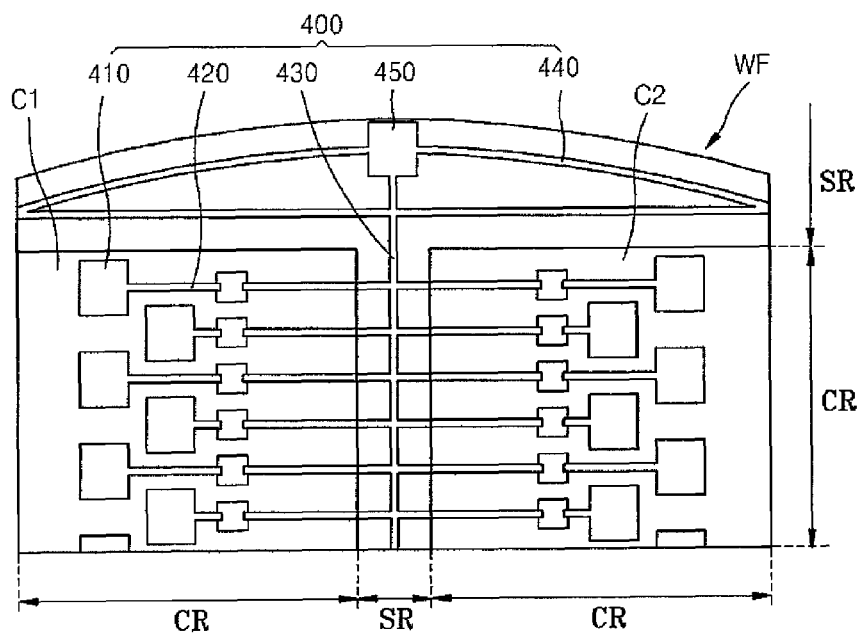
FIG. 10 is a plane view of a first re-wiring layer according to an exemplary embodiment of the inventive concept.

FIG. 10 is a plane view of a first re-wiring layer 400 according to an embodiment of the inventive concept. More specifically, FIG. 10 is a magnified plane view of portion X in FIG. 9.

Referring to FIG. 10, the first re-wiring layer 400 may further include, for example, the extension connection unit 440 and a plating pad unit 450, besides the first extension pad portion 410, the first extension portion 420, and the first connection unit 430. The extension connection unit 440 and the plating pad unit 450 may be formed, for example, together with the first extension pad portion 410, the first extension portion 420, and the first connection unit 430 by using the same method used to formed the first extension pad portion 410, the first extension portion 420, and the first connection unit 430.

The extension connection unit 440 may connect all of the first connection units 430. The plating pad unit 450 may be a portion of the first connection unit 430 or a portion of the first re-wiring layer 400 that is connected to the extension connection unit 440 and may be disposed adjacent to an edge of the wafer WF. The plating pad unit 450 may be used for supplying power for electro-plating when a second re-wiring layer (not shown), which will be described below, is formed by using an electro-plating method.

Figure 11:
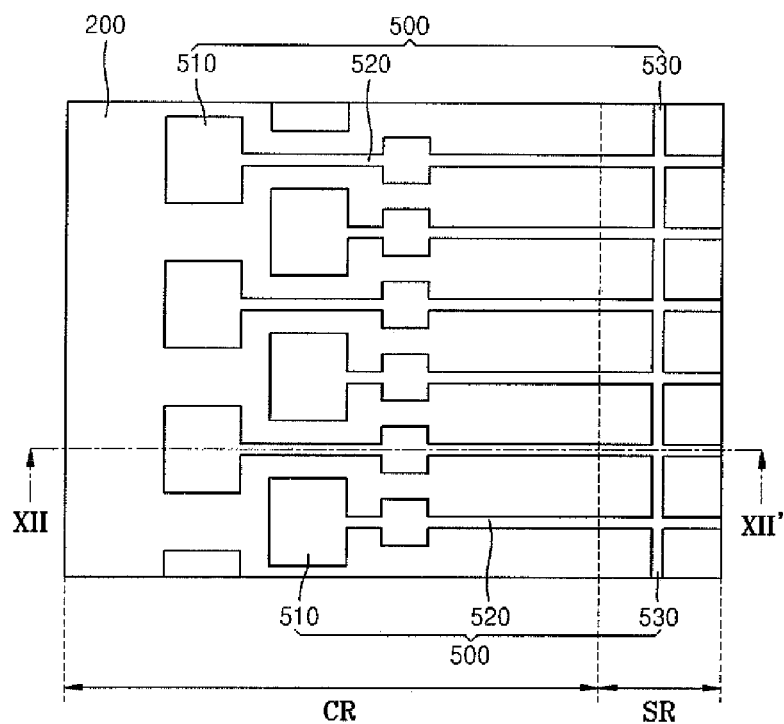
FIGS. 11 and 12 are respectively a plane view and a cross-sectional view showing an operation of forming a second re-wiring layer according to an exemplary embodiment of the inventive concept.
Figure 12:
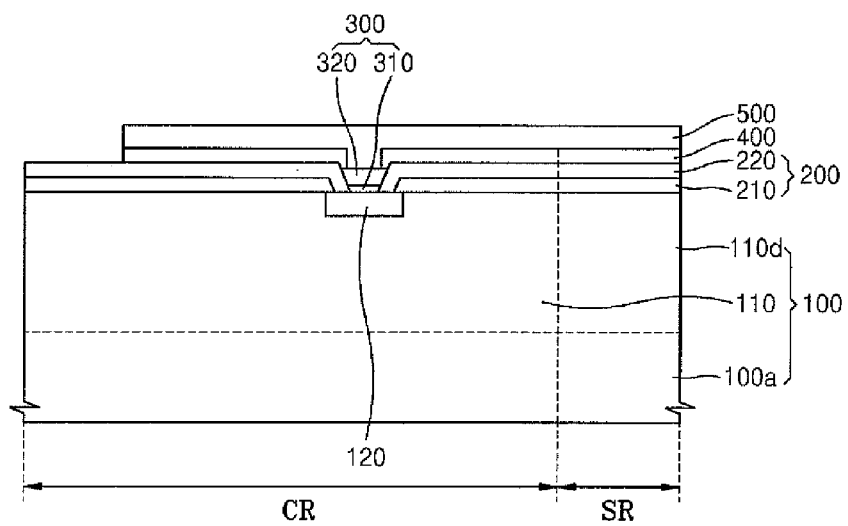

FIGS. 11 and 12 are respectively a plane view and a cross-sectional view showing an operation of forming a second re-wiring layer 500, according to an exemplary embodiment of the inventive concept. More specifically, FIG. 12 is a cross-sectional view taken along line XII-XII' of FIG. 11.

Referring to FIGS. 11 and 12, the second re-wiring layer 500 is formed on the metal bump layer 320 and the first re-wiring layer 400. The second re-wiring layer 500 may be formed using, for example, an electro-plating method. Power supply for electro-plating the second re-wiring layer 500 may be realized through the first re-wiring layer 400 formed in the scribe lane region SR, that is, the first connection unit 430 shown in FIGS. 5 through 8. For electro-plating for forming the second re-wiring layer 500, power may be directly applied from the outside to the plating pad unit 450 formed adjacent to the edge of the wafer WF shown in FIG. 10. The second re-wiring layer 500 may be formed of, for example, gold or copper. The second re-wiring layer 500 may be formed, for example, to cover all upper surfaces of the first re-wiring layer 400 and the exposed metal bump layer 320 in the chip region CR. When the metal pad 120 is exposed by not forming the metal bump layer 320, the second re-wiring layer 500 may be formed to cover all upper surfaces of the first re-wiring layer 400 and the metal pad 120 in the chip region CR.

The second re-wiring layer 500 may, for example, directly contact the first re-wiring layer 400 and the metal bump layer 320 or the metal pad 120. Although an electrical resistance of the first re-wiring layer 400 may be relatively high in comparison to the electrical resistance of the second re-wiring layer 500 because the first re-wiring layer 400 is formed by a printing method, when the second re-wiring layer 500 having a relatively low electrical resistance directly contacts the metal bump layer 320 or the metal pad 120, a contact resistance may be reduced, and thus, power source/ground/signal may be transmitted to the circuit unit 110 without loss. Accordingly, the first re-wiring layer 400 may be formed to cover a portion of the metal bump layer 320 or the metal pad 120. The first re-wiring layer 400 may perform as, for example, a seed for electro-plating the second re-wiring layer 500. In this case, the second re-wiring layer 500 may be formed to have, for example, a thickness greater than that of the first re-wiring layer 400.

The second re-wiring layer 500 may include, for example, a second extension pad portion 510, a second extension portion 520, and a second connection unit 530. The second extension pad portion 510 may be a portion of the second re-wiring layer 500 formed on the first extension pad portion 410, and the second connection unit 530 may be a portion of the second re-wiring layer 500 formed on the first connection unit 430. The second extension portion 520 is a portion of the second re-wiring layer 500 that connects the second extension pad portion 510 and the second connection unit 530 to each other. The second extension portion 520 may be a portion of the second re-wiring layer 500 formed on the first extension pad portion 410 and the metal bump layer 320.

Because the second re-wiring layers 500 may cover upper surfaces of the metal bump layers 320 or the metal pads 120 together with the first re-wiring layers 400, all of the second re-wiring layers 500 may be electrically connected.

As described below, the first connection units 430 and the second connection units 530 may be removed in a process of cutting the scribe lane regions SR to separate the chip regions CR. Accordingly, the first and second first re-wiring layers 400 and 500 connected through the first and second connection units 430 and 530 formed in the scribe lane regions SR may be separated from each other.

Figure 13:
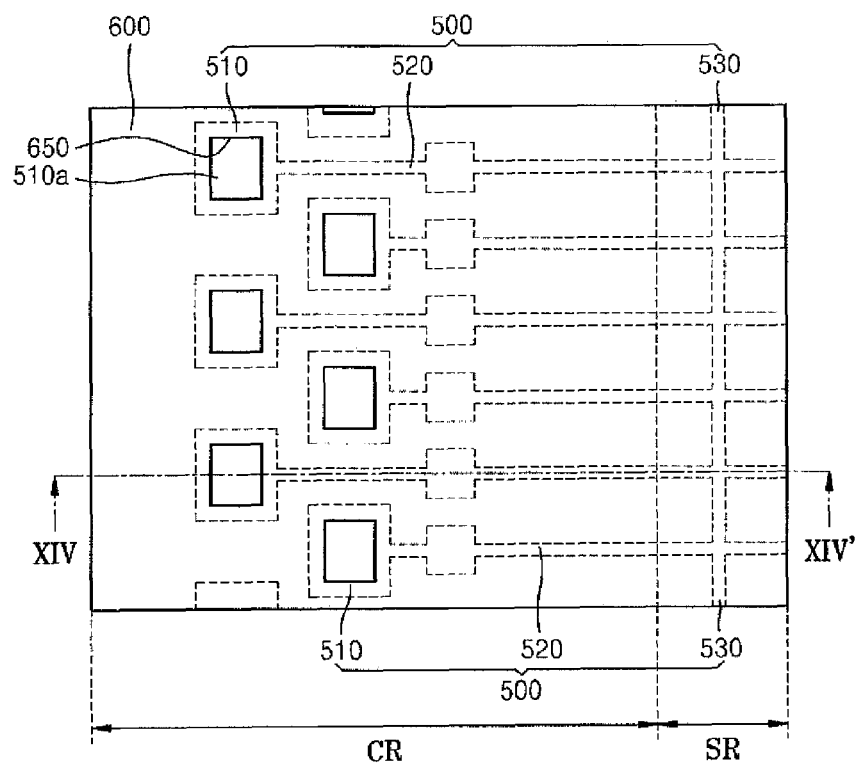
FIGS. 13 and 14 are respectively a plane view and a cross-sectional view showing an operation of forming an auxiliary passivation layer, according to an exemplary embodiment of the inventive concept.
Figure 14:
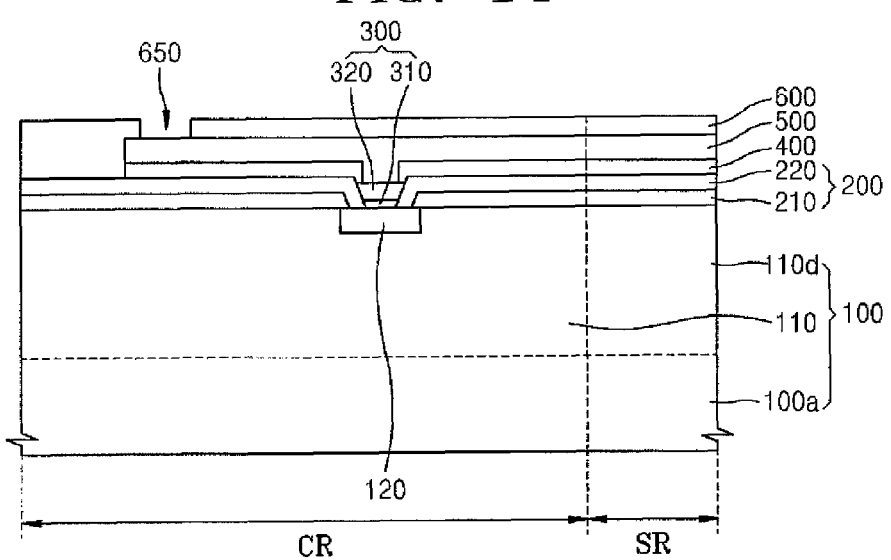

FIGS. 13 and 14 are respectively a plane view and a cross-sectional view showing an operation of forming an auxiliary passivation layer 600 according to an exemplary embodiment of the inventive concept. More specifically, FIG. 14 is a cross-sectional view taken along line XIV-XIV' of FIG. 13.

Referring to FIGS. 13 and 14, the auxiliary passivation layer 600 may be formed, for example, on an entire surface of the semiconductor substrate 100 to expose a portion of the second extension pad portion 510. The auxiliary passivation layer 600 may include, for example, an opening 650 that exposes a portion of the second extension pad portion 510. The second extension pad portion 510 exposed by the opening 650 may be used as an external connection pad 510a. The auxiliary passivation layer 600 may be used for protecting the second re-wiring layer 500 except the external connection pad 510a that is practically used for connecting to an external device. The auxiliary passivation layer 600 may be formed of, for example, an insulating polymer.

Figure 15:
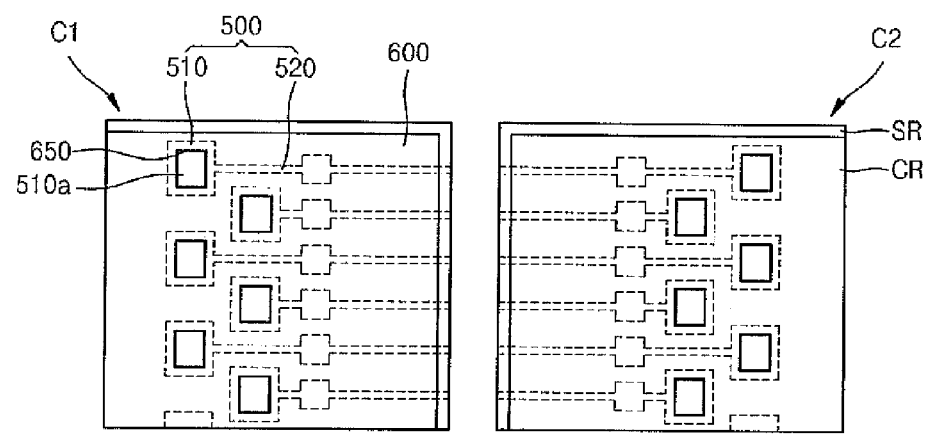
FIG. 15 is a plane view showing an operation of separating chip regions, according to an exemplary embodiment of the inventive concept.

FIG. 15 is a plane view showing an operation of separating chip regions CR, according to an exemplary embodiment of the inventive concept. More specifically, FIG. 15 is a cross-sectional view showing an operation of separating portions of the wafer WF corresponding to the chip regions CR.

Referring to FIGS. 10 and 15, individual semiconductor chips C1 and C2 which are separated chip regions CR are formed by cutting the wafer WF along the scribe lane regions SR. A portion of the scribe lane regions SR may be removed during the process of forming the individual semiconductor chips C1 and C2. The second connection unit 530 shown in FIG. 9 may be included in the portion of the scribe lane regions SR that will be removed in the process of forming the individual semiconductor chips C1 and C2. Also, the first connection unit 430 shown in FIG. 7 may be formed, for example, under the second connection unit 530. Accordingly, in the process of separating the individual semiconductor chips C1 and C2, the first connection unit 430 and the second connection unit 530 may be removed. Accordingly, the first and second re-wiring layers 400 and 500, which are separated from each other in the chip regions CR and are connected to each other in the scribe lane regions SR through the first and second connection units 430 and 530, may be separated from each other in the process of separating the chip regions CR into the individual semiconductor chips C1 and C2.

The first connection unit 430 is used for supplying power for electro-plating for forming the second re-wiring layer 500, and the second connection unit 530 is an element formed on the first connection unit 430. Accordingly, because the first and second connection units 430 and 530 are not elements for practically operating the individual semiconductor chips C1 and C2, all of the first and second connection units 430 and 530 may be removed in the process of forming the individual semiconductor chips C1 and C2.

When the scribe lane regions SR that are removed in the process of forming the individual semiconductor chips C1 and C2 have a width of approximately a few tens of μm, the first and second connection units 430 and 530 may be formed to have a width of approximately a few μm. In this case, when cutting the scribe lane regions SR is performed along the first and second connection units 430 and 530, the first and second connection units 430 and 530 may be readily cut.

Figure 16:
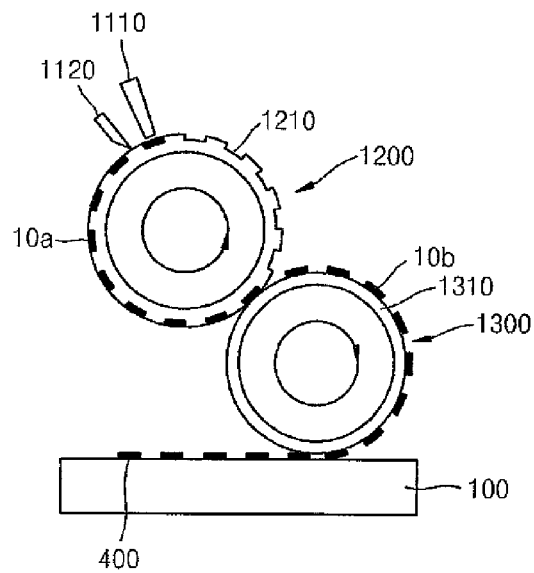
FIGS. 16 through 18 are conceptual schematic diagrams for explaining roll off set printing methods used to form a first re-wiring layer, according to an exemplary embodiment of the inventive concept.
Figure 17:
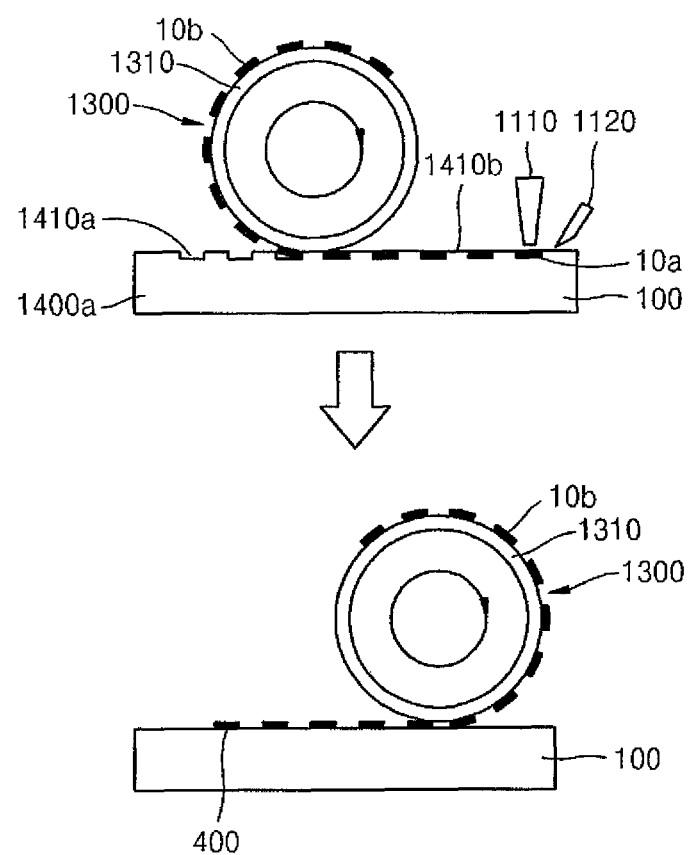
Figure 18:
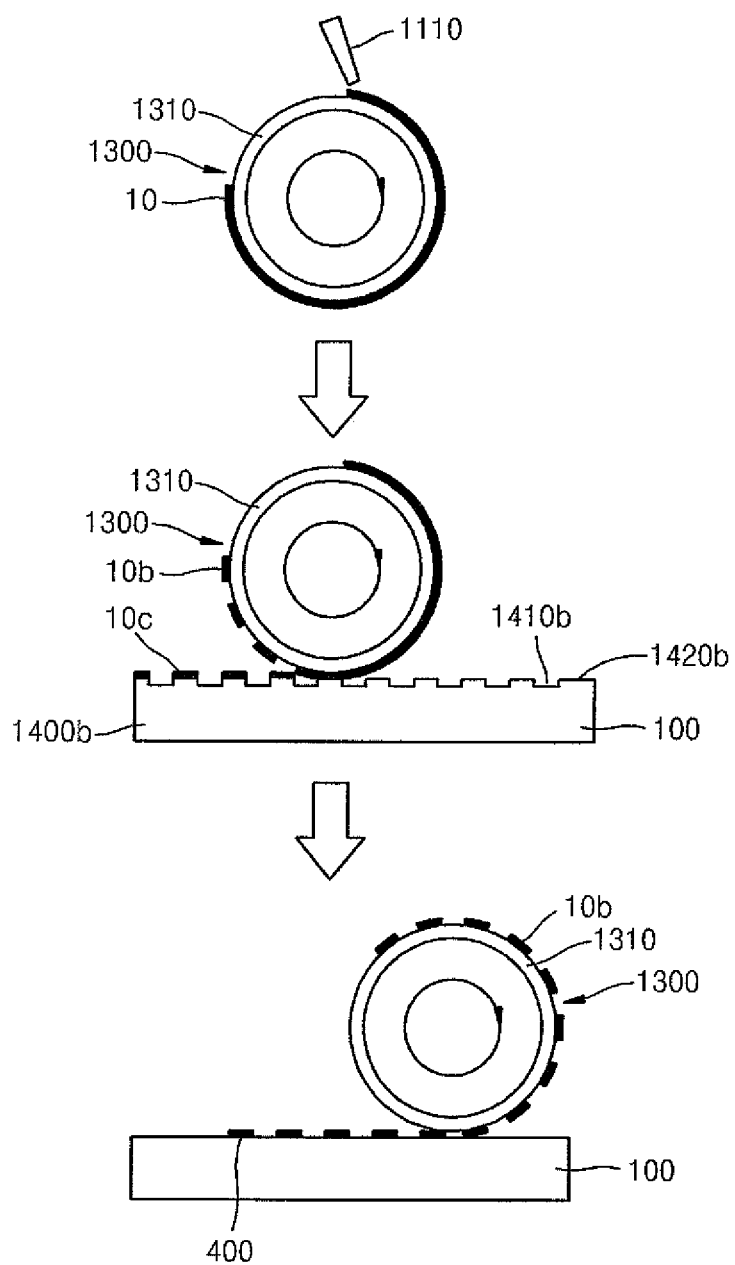

FIGS. 16 through 18 are conceptual schematic diagrams for explaining roll off-set printing methods used to form the first re-wiring layer 400, according to an exemplary embodiment of the inventive concept.

FIG. 16 is a conceptual drawing for explaining a roll off-set printing method used for forming the first re-wiring layer 400, according to an exemplary embodiment of the inventive concept.

Referring to FIG. 16, a paste or an ink 10a is supplied from an inlet 1110 to a gravure roll 1200. A doctor blade 1120 may remove the remaining paste or ink 10a so that the paste or the ink 10a is filled in grooves 1210 of the gravure roll 1200. The grooves 1210 of the gravure roll 1200 may be formed, for example, in consideration of the shape of the first re-wiring layer 400.

The paste or the ink 10a filled in the grooves 1210 of the gravure roll 1200 may be transferred to a silicon blanket roll 1300 that rotates in contact with the gravure roll 1200 and may form a preliminary re-wiring material 10b on a silicon layer 1310 that surrounds a surface of the silicon blanket roll 1300 (OFF). Because the silicon blanket roll 1300 rotates in contact with the semiconductor substrate 100, the preliminary re-wiring material 10b is transferred onto the semiconductor substrate 100, and thus, the first re-wiring layer 400 is formed (SET).

FIG. 17 is a conceptual schematic diagram for explaining a roll off-set printing method used for forming the first re-wiring layer 400, according to an exemplary embodiment of the inventive concept.

Referring to FIG. 17, the paste or the ink 10a is supplied from the inlet 1110 to a cliché 1400a. The doctor blade 1120 may remove the remaining paste or ink 10a from an upper surface 1410b of the cliché 1400a so that the paste or the ink 10a is filled in grooves 1410a of the cliché 1400a. The grooves 1410a of the cliché 1400a may be formed, for example, in consideration of the shape of the first re-wiring layer 400.

The paste or the ink 10a filled in the grooves 1410a of the cliché 1400a may be transferred to the silicon blanket roll 1300 that rotates in contact with the gravure roll 1200 and may form the preliminary re-wiring material 10b on the silicon layer 1310 that surrounds a surface of the silicon blanket roll 1300 (OFF). Because the silicon blanket roll 1300 rotates in contact with the semiconductor substrate 100, the preliminary re-wiring material 10b may be transferred onto the semiconductor substrate 100, and thus, the first re-wiring layer 400 is formed (SET).

FIG. 18 is a conceptual drawing for explaining a roll off-set printing method used for forming the first re-wiring layer 400, according to an exemplary embodiment of the inventive concept.

Referring to FIG. 18, a paste layer or an ink layer 10 is formed on the silicon blanket roll 1300 by supplying the paste or the ink 10a to the silicon blanket roll 1300. The silicon blanket roll 1300 having the paste layer or the ink layer 10 rotates in contact with the cliché 1400b, and thus, the paste or the ink 10c may be transferred onto a surface of the cliché 1400b. Because grooves 1410b of the cliché 1400b do not contact the paste layer or the ink layer 10 formed on the silicon blanket roll 1300, the remaining portion of the paste layer or the ink layer 10 on the silicon blanket roll 1300 may form the preliminary re-wiring material 10b by the grooves 1410b of the cliché 1400b (Reverse-OFF). Because the silicon blanket roll 1300 rotates in contact with the semiconductor substrate 100, the preliminary re-wiring material 10b may be transferred onto the semiconductor substrate 100, and thus, the first re-wiring layer 400 is formed (SET).

The first re-wiring layer 400 may be formed through a single printing on a semiconductor wafer for forming a plurality of individual semiconductor chips by using the roll off-set printing methods described with reference to FIGS. 16 through 18. Accordingly, manufacturing costs may be reduced.

In FIGS. 16 through 18, roll off-set printing methods of a soft lithography process are shown. However, all soft lithography except photolithography that does not use a photomask may be used for forming the first re-wiring layer 400.

Having described exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of fabricating a semiconductor device, the method comprising:
preparing a semiconductor substrate having a circuit unit on an upper surface thereof, a metal pad electrically connected to the circuit unit, and a passivation layer that covers the circuit unit and exposes the metal pad;
forming a first re-wiring layer that is electrically connected to the metal pad and is formed by a printing method to extend from the metal pad on the passivation layer; and
forming a second re-wiring layer on the first re-wiring layer using the first re-wiring layer as a seed by using an electro plating process.

2. The method of claim 1, wherein the forming of the first re-wiring layer comprises forming the first re-wiring layer to cover a portion of an upper surface of the metal pad, and the forming of the second re-wiring layer comprises forming the second re-wiring layer on the first re-wiring layer and the metal pad.

3. The method of claim 2, further comprising electroless plating a metal bump layer that covers the metal pad exposed by the passivation layer before forming the first re-wiring layer, wherein the first re-wiring layer is formed to expose a portion of the metal bump layer, and the second re-wiring layer is formed to cover the first re-wiring layer and the metal bump layer.

4. The method of claim 3, further comprising zincate processing a surface of the metal pad before electroless plating the metal bump layer.

5. The method of claim 4, wherein the zincate processing comprises removing a natural oxide film formed on a surface of the metal pad.

6. The method of claim 3, wherein the electroless plating the metal bump layer comprises forming the metal bump layer only on the metal pad.

7. The method of claim 3, wherein the metal bump layer comprises nickel.

8. The method of claim 1, wherein the first re-wiring layer is formed by a printing method using a paste that comprises one of silver, nickel, or copper.

9. The method of claim 1, wherein the second re-wiring layer comprises one of gold or copper.

10. The method of claim 1, wherein the forming of the first re-wiring layer comprises fowling the first re-wiring layer by using a roll off-set printing method.

11. The method of claim 1, wherein the semiconductor substrate comprises a plurality of chip regions where the circuit unit is formed, a plurality of scribe lane regions around the chip regions, and a plurality of the metal pads, wherein the first re-wiring layer that extends from one of the metal pads on the passivation layer is fowled separated from the first re-wiring layer that extends from another metal pad to the passivation layer in the chip region, and wherein each of the first re-wiring layers that extend from the metal pads is formed extending from the chip regions to the scribe lane regions, and wherein each of the first re-wiring layers that extend from the metal pads forms connection units that are connected to each other in the scribe lane regions.

12. The method of claim 11, wherein the chip regions are provided in multiple numbers, and the method further comprising separating the chip regions into a plurality of individual chip regions by cutting the connection units along the scribe lane regions after forming the second re-wiring layer.

13. The method of claim 1, wherein the forming of the passivation layer that covers at least a portion of the second re-wiring layer is performed before the separating of the chip regions into the individual chip regions.

14. A method of fabricating a semiconductor device, the method comprising:
preparing a semiconductor substrate having a circuit unit, a metal pad electrically connected to the circuit unit, and a passivation layer that covers the circuit unit and exposes the metal pad; and
forming a re-wiring layer that is electrically connected to the metal pad on the metal pad and the passivation layer by using a roll off-set printing method.

15. The method of claim 14, wherein the forming of the re-wiring layer comprises forming the re-wiring layer by using a roll off-set printing method that uses a silicon blanket roll.

* * * * *